US012574064B2

(12) United States Patent
Tanaka et al.

(10) Patent No.: US 12,574,064 B2
(45) Date of Patent: Mar. 10, 2026

(54) RADIO FREQUENCY CIRCUIT, RADIO FREQUENCY MODULE, AND COMMUNICATION DEVICE

(71) Applicant: Murata Manufacturing Co., Ltd., Nagaokakyo (JP)

(72) Inventors: Satoshi Tanaka, Nagaokakyo (JP); Atsushi Ono, Nagaokakyo (JP); Hirotsugu Mori, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 373 days.

(21) Appl. No.: 18/334,418

(22) Filed: Jun. 14, 2023

(65) Prior Publication Data

US 2024/0022280 A1     Jan. 18, 2024

Related U.S. Application Data

(63) Continuation of application No. PCT/JP2021/043672, filed on Nov. 29, 2021.

(30) Foreign Application Priority Data

Dec. 21, 2020     (JP) ................................. 2020-211153

(51) Int. Cl.
| | |
|---|---|
| *H04B 1/40* | (2015.01) |
| *H01P 5/12* | (2006.01) |
| *H03L 7/18* | (2006.01) |

(52) U.S. Cl.
CPC ................. H04B 1/40 (2013.01); H01P 5/12 (2013.01); H03L 7/18 (2013.01)

(58) Field of Classification Search
CPC .... H04B 1/40; H04B 1/04; H01P 5/12; H03L 7/18; H03F 1/02; H03F 3/189; H03F 3/24; H03F 3/68
See application file for complete search history.

(56) References Cited

U.S. PATENT DOCUMENTS

| | | | | |
|---|---|---|---|---|
| 6,252,461 B1 * | 6/2001 | Raab | ....................... | H03F 1/565 |
| | | | | 330/306 |
| 7,427,894 B2 * | 9/2008 | Dow | ......................... | H03F 3/72 |
| | | | | 330/129 |

(Continued)

FOREIGN PATENT DOCUMENTS

| | | |
|---|---|---|
| JP | H06-152262 A | 5/1994 |
| JP | H08-23246 A | 1/1996 |

(Continued)

OTHER PUBLICATIONS

International Search Report and Written Opinion mailed on Feb. 15, 2022, received for PCT Application PCT/JP2021/043672, filed on Nov. 29, 2021, 13 pages including English Translation.

(Continued)

*Primary Examiner* — Santiago Garcia
(74) *Attorney, Agent, or Firm* — XSENSUS LLP

(57) ABSTRACT

A radio frequency circuit includes: a divider circuit configured to divide a radio frequency signal input through a first terminal, and output radio frequency signals resulting from the dividing, respectively through a second terminal and a third terminal; a combiner circuit configured to combine a radio frequency signal input through a fourth terminal and a radio frequency signal input through a fifth terminal, and output a radio frequency signal resulting from the combining, through a sixth terminal; a first amplifier disposed on a first path connecting the second terminal and the fourth terminal; a second amplifier disposed on a second path connecting the third terminal and the fifth terminal; and a first switch connected between the third terminal and an input terminal of the second amplifier, the first switch being switched between a conducting state and a non-conducting state according to a power class.

20 Claims, 6 Drawing Sheets

(56) References Cited

U.S. PATENT DOCUMENTS

| | | | | |
|---|---|---|---|---|
| 7,471,738 | B2 * | 12/2008 | Chan ................... | H03G 3/3042 |
| | | | | 375/297 |
| 8,432,219 | B1 * | 4/2013 | Cook ....................... | H03F 3/72 |
| | | | | 330/135 |
| 8,971,830 | B2 * | 3/2015 | Hadjichristos ........ | H03F 1/0277 |
| | | | | 455/552.1 |
| 10,211,861 | B2 * | 2/2019 | Vaillancourt .......... | H03F 3/245 |
| 2006/0116088 | A1 * | 6/2006 | Block ................. | H04B 1/0483 |
| | | | | 455/127.1 |
| 2007/0222512 | A1 * | 9/2007 | Krishnamurthy ..... | H03F 1/0266 |
| | | | | 330/149 |
| 2008/0136512 | A1 * | 6/2008 | Dow ....................... | H03F 3/193 |
| | | | | 330/51 |
| 2014/0134960 | A1 * | 5/2014 | Tasic ........................ | H03F 3/68 |
| | | | | 455/73 |
| 2015/0155831 | A1 * | 6/2015 | Shirvani ................. | H03F 1/223 |
| | | | | 330/295 |
| 2016/0276983 | A1 * | 9/2016 | Vaillancourt ............. | H03F 3/72 |
| 2017/0093339 | A1 * | 3/2017 | Wu ....................... | H03F 1/0216 |
| 2020/0067540 | A1 * | 2/2020 | Xu ........................... | H03F 1/565 |
| 2024/0405424 | A1 * | 12/2024 | Wu ........................... | H03F 3/45 |

FOREIGN PATENT DOCUMENTS

| | | |
|---|---|---|
| JP | H10-308639 A | 11/1998 |
| JP | 2006-222828 A | 8/2006 |
| JP | 2007-124202 A | 5/2007 |
| JP | 2008-035487 A | 2/2008 |
| JP | 2010-118916 A | 5/2010 |
| JP | 2012-205212 A | 10/2012 |
| JP | 2013-106293 A | 5/2013 |
| JP | 2015-027084 A | 2/2015 |
| JP | 2015-039087 A | 2/2015 |
| WO | 2019/054176 A1 | 3/2019 |

OTHER PUBLICATIONS

3GPP, "User Equipment(UE) radio transmission and reception; Part 3: Range 1 and Range 2 Interworking operation with other radios (Release 16)" 3GPP TS 38.101-3 V16.5.0, Sep. 2020, pp. 252-262.
3GPP, "Evolved Universal Terrestrial Radio Access (E-UTRA) and NR; High-power UE operation for fixed-wireless/ vehicle-mounted use cases in Band 12, Band 5, and Band n71 (Release 17)", 3GPP TR 37.880 V0.1.0, Oct. 2020, 30 pages.
Moderator (T-Mobile USA), "Email discussion summary for 96e[123] LTE_NR_B41_Bn41_PC29dBm", 3GPP TSG-RAN WG4 Meeting # 96-e, R4-2011863, Aug. 17-28, 2020, 7 pages.
Man Hung Ng (Nokia), "Email discussion summary for [96e][143] FS_LTE_NR_HPUE_FWVM", 3GPP TSG-RAN WG4 Meeting # 96-e-Bis, R4-2011880, Aug. 17-28, 2020, 10 pages.

* cited by examiner

FIG. 1

RADIO FREQUENCY CIRCUIT, RADIO FREQUENCY MODULE, AND COMMUNICATION DEVICE

CROSS-REFERENCE TO RELATED APPLICATIONS

This application is a continuation application of PCT International Application No. PCT/JP2021/043672 filed on Nov. 29, 2021, designating the United States of America, which is based on and claims priority to Japanese Patent Application No. 2020-211153 filed on Dec. 21, 2020. The entire disclosures of the above-identified applications, including the specifications, drawings and claims are incorporated herein by reference in their entirety.

TECHNICAL FIELD

The present disclosure relates to a radio frequency (RF) circuit, a radio frequency module, and a communication device.

BACKGROUND

Mobile communication devices such as mobile phones include a power amplifier that amplifies a radio frequency transmission signal.

Japanese Unexamined Patent Application Publication No. 2010-118916 discloses a differential power amplifier that includes: a first transistor which receives an input of a non-inverted input signal; a second transistor which receives an input of an inverted input signal; and a transformer disposed on the output terminal side of the first transistor and the second transistor. The transformer includes magnetically-coupled two primary coils and one secondary coil. The two primary coils are connected to each other in parallel, and each magnetically coupled to the secondary coil, allowing the input impedance of the primary coils to be reduced without decreasing Q-factors. As a result, it is possible to improve power gain.

SUMMARY

Technical Problems

In the 3rd generation partnership project (3GPP), a mobile system that outputs a high-power transmission signal corresponding to a high power class (e.g., power class 1.5 (maximum output power: 29 dBm)) has been under discussion.

However, with existing power amplifier circuits including the differential power amplifier described in Japanese Unexamined Patent Application Publication No. 2010-118916, there are instances where the signal quality and/or power efficiency will be degraded when the power amplifier circuit supports both high power and non-high power classes. It is thus necessary to separately provide a power amplifier circuit for the non-hyperpower class and a power amplifier circuit for the hyperpower class, but in this case, the circuits increase in size.

The present disclosure addresses the above-described problems, and is presented to provide a radio frequency circuit, a radio frequency module, and a communication device with small sizes which can support a wide range of power classes.

Solutions

A radio frequency circuit according to one aspect of the present disclosure includes: a divider circuit configured to divide a radio frequency signal input through a first terminal, and output radio frequency signals resulting from the dividing, respectively through a second terminal and a third terminal; a combiner circuit configured to combine a radio frequency signal input through a fourth terminal and a radio frequency signal input through a fifth terminal, and output a radio frequency signal resulting from the combining, through a sixth terminal; a first amplifier disposed on a first path connecting the second terminal and the fourth terminal, the first amplifier being configured to amplify a radio frequency signal output through the second terminal, and output the radio frequency signal amplified to the fourth terminal; a second amplifier disposed on a second path connecting the third terminal and the fifth terminal, the second amplifier being configured to amplify a radio frequency signal output through the third terminal, and output the radio frequency signal amplified to the fifth terminal; and a first switch connected between the third terminal and an input terminal of the second amplifier.

Advantageous Effects

According to the present disclosure, a radio frequency circuit, a radio frequency module, and a communication device with small sizes which can support a wide range of power classes are provided.

BRIEF DESCRIPTION OF DRAWINGS

These and other advantages and features will become apparent from the following description thereof taken in conjunction with the accompanying Drawings, by way of non-limiting examples of embodiments disclosed herein.

FIG. 1 is a diagram illustrating a circuit configuration of a radio frequency circuit, a radio frequency module (or RF front-end circuitry), and a communication device according to an embodiment.

DESCRIPTION OF EMBODIMENTS

Figure 2:
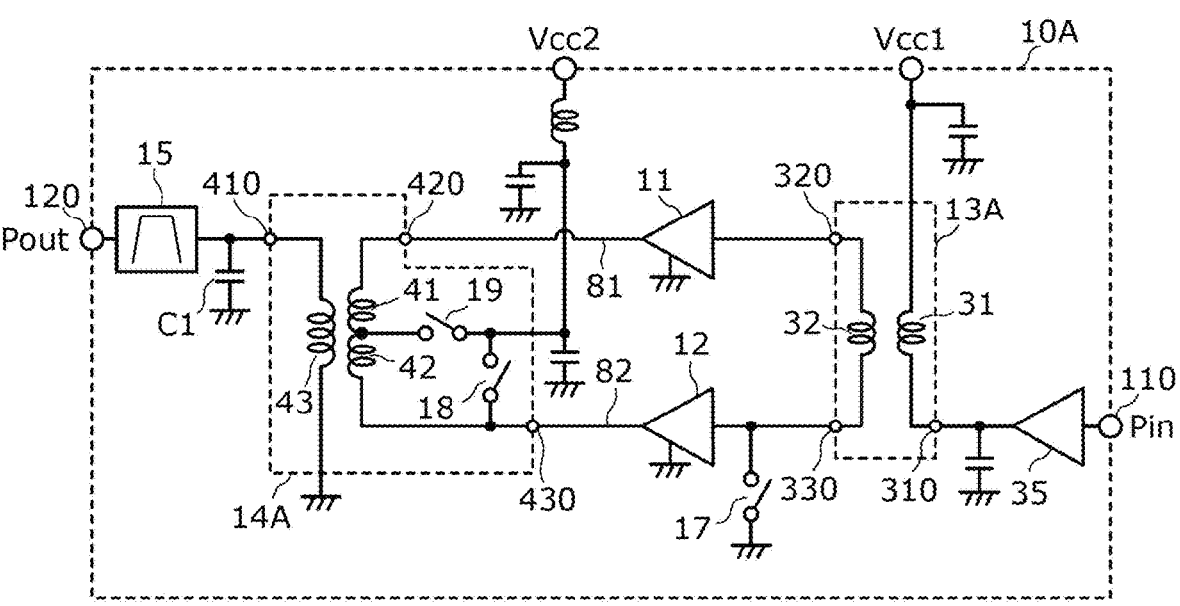
FIG. 2 is a diagram illustrating a circuit configuration of the radio frequency circuit which includes a differential amplifier according to the embodiment.

The following describes in detail embodiments of the present disclosure. It should be noted that the embodiments described below each show a general or specific example. The numerical values, shapes, materials, structural components, the arrangement and connection of the structural components, and so on, illustrated in the following embodiments are mere examples, and therefore do not limit the present disclosure. Among the structural components in the following working examples and variations, structural components not recited in the independent claims are described as arbitrary structural components. In addition, the sizes of structural components and the ratios of the sizes in the drawings are not necessarily strictly illustrated. In each of the diagrams, substantially the same structural components are denoted by the same reference signs, and redundant description may be omitted or simplified.

In addition, in the following description, terms indicating relationships between components such as parallel and vertical and terms indicating the shapes of components such as a quadrilateral shape, and numerical ranges do not represent only the strict meanings but include also a substantially equivalent range, such as a difference of approximately several percent.

In addition, in the following description, in an example of A, B, and C being mounted on a board, "in a plan view of the board (or the principal surface of the board), C is disposed between A and B" means that at least one of a plurality of line segments connecting arbitrary points in A and arbitrary points in B passes through a region in C in a plan view of the board. Furthermore, a plan view of the board means that the board and circuit elements mounted on the board are orthographically projected on a plane parallel to the principal surface of the board.

Furthermore, a "path" refers to a transfer path including a line along which a radio frequency signal propagates, an electrode directly connected to the line, a terminal directly connected to the line or the electrode, etc.

Embodiment

1. Circuit Configuration of Radio Frequency Module 1 and Communication Device 5

Figure 1:
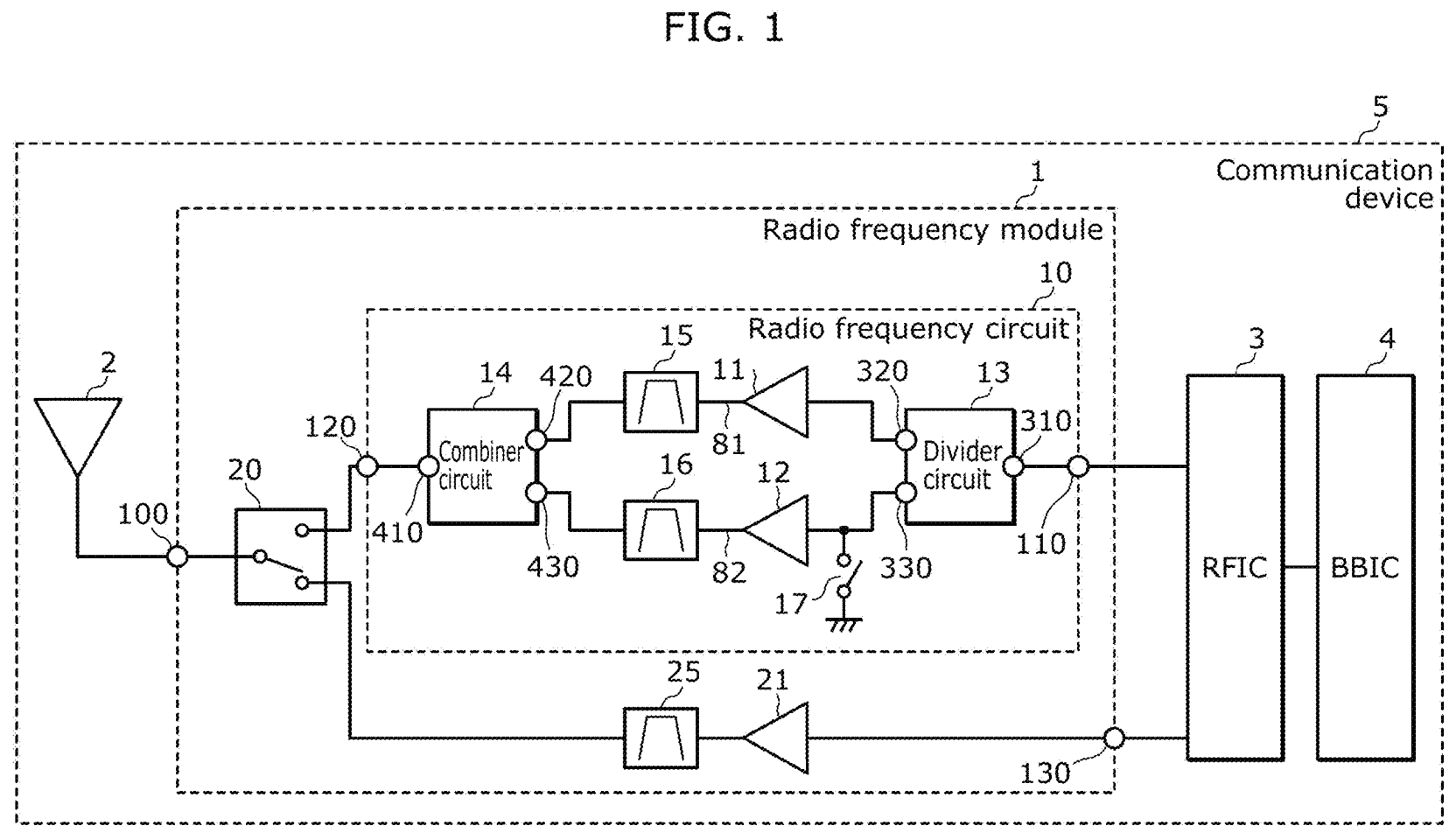

FIG. 1 is a diagram illustrating a circuit configuration of radio frequency circuit 10, radio frequency module 1, and communication device 5 according to an embodiment. As illustrated in this diagram, communication device 5 includes radio frequency module 1, antenna 2, RF signal processing circuit (RFIC) 3, and baseband signal processing circuit (BBIC) 4.

RFIC 3 is an RF signal processing circuit that processes a radio frequency signal to be transmitted by antenna 2 and processes a radio frequency signal received by antenna 2. More specifically, RFIC 3 performs signal processing, by up-conversion or the like, on a transmission signal input from BBIC 4, and outputs the transmission signal generated by the signal processing to the transmission path of radio frequency module 1.

BBIC 4 is a circuit that performs signal processing using an intermediate frequency band having a lower frequency than a frequency band of a radio frequency signal that is transferred through radio frequency module 1. The signal processed by BBIC 4 is, for example, used as an image signal for image display or as a sound signal for conversation via a speaker.

RFIC 3 also has a function as a controller that controls the connection of switch 20 included in radio frequency module 1, based on a communication band (frequency band) used.

RFIC 3 also has a function as a controller that controls the gains of power amplifiers 11, 12, and 21 included by radio frequency module 1, and power supply voltage Vcc and bias voltage Vbias that are supplied to power amplifiers 11, 12, and 21. In addition, the controller may be disposed outside RFIC 3, for example, in BBIC 4.

Antenna 2 is connected to antenna connection terminal 100 of radio frequency module 1, and emits a radio frequency signal that has been output from radio frequency module 1.

It should be noted that, in communication device 5 according to the present embodiment, antenna 2 and BBIC 4 are not indispensable components.

Next, a detailed configuration of radio frequency module 1 will be described.

As illustrated in FIG. 1, radio frequency module 1 includes antenna connection terminal 100, switch 20, radio frequency circuit 10, power amplifier 21, and filter 25.

Antenna connection terminal 100 is a common antenna terminal connected to antenna 2.

Radio frequency circuit 10 is an amplifier circuit that amplifies a transmission signal of a first band that has been input through transmission input terminal 110, and outputs the transmission signal that has been amplified through transmission output terminal 120. Radio frequency circuit 10 includes transmission input terminal 110, transmission output terminal 120, power amplifiers 11 and 12, divider circuit 13, combiner circuit 14, filters 15 and 16, and switch 17.

Divider circuit 13 divides a radio frequency signal input through terminal 310 (first terminal), and outputs radio frequency signals resulting from the dividing, respectively through terminal 320 (second terminal) and terminal 330 (third terminal).

Combiner circuit 14 combines the radio frequency signal input through terminal 420 (fourth terminal) and the radio frequency signal input through terminal 430 (fifth terminal), and outputs the radio frequency signal resulting from the combining, from terminal 410 (sixth terminal).

Power amplifier 11 is one example of a first amplifier, and is disposed on path 81 (first path) that connects terminal 320 and terminal 420. Power amplifier 11 amplifies a transmission signal of the first band.

Power amplifier 12 is one example of a second amplifier, and is disposed on path 82 (second path) that connects terminal 330 and terminal 430. Power amplifier 12 amplifies a transmission signal of the first band.

Switch 17 is one example of a first switch, and is a so-called shunt-type switch having one end connected to the path that connects terminal 330 and the input terminal of power amplifier 12 and the other end connected to ground. It should be noted that switch 17 may be a so-called series-type switch disposed in series on the path that connects terminal 330 and the input terminal of power amplifier 12.

Filter 15 is one example of a second filter, is disposed on path 81, and includes the first band in the pass band. Filter 16 is one example of a third filter, is disposed on path 82, and includes the first band in the pass band.

Here, when switch 17 is in the conducting state, the radio frequency signal of the first band is transferred through path 81 and the radio frequency signal of the first band is not transferred through path 82. On the other hand, when switch 17 is in the non-conducting state, the radio frequency signal of the first band is transferred through both paths 81 and 82.

According to the above-described configuration of radio frequency circuit 10, by switching between the conducting state and the non-conducting state of switch 17, it is possible to select: transferring a radio frequency signal resulting from power-combining the signals transferred through paths 81 and 82; or transferring only a radio frequency signal transferred through path 81. As a result, it is possible to provide radio frequency circuit 10 which can support both a high power class and non-high power class.

It should be noted that the power class is a classification of output power of a terminal defined by maximum output power, etc., and it is indicated that a smaller power class value corresponds to a higher power output. The maximum output power is defined as the output power at the antenna end of the terminal. The measurement of the maximum output power is performed in a manner that is defined by, for example, 3GPP. For example, in FIG. 1, the maximum output power is measured by measuring emission power at antenna 2. Instead of measuring the emission power, the output power of antenna 2 can also be measured by providing a terminal in proximity to antenna 2 and connecting a measuring instrument (e.g., spectrum analyzer) to the terminal.

Power amplifier 21 is one example of a third power amplifier, and amplifies a transmission signal of the second band that has been input through transmission input terminal 130.

Filter 25 is one example of a first filter, is connected to an output terminal of power amplifier 21, and includes the second band in the pass band.

Switch 20 is one example of a fifth switch, and includes a common terminal and two selection terminals. The common terminal is connected to antenna connection terminal 100. One of the selection terminals is connected to transmission output terminal 120, and the other is connected to filter 25. With the above-described connection configuration, switch 20 switches between (i) the connection between radio frequency circuit 10 and antenna connection terminal 100, and (ii) the connection between filter 25 and antenna connection terminal 100. It should be noted that switch 20 may be a multiple-connection switch that simultaneously performs (i) the connection between radio frequency circuit 10 and antenna connection terminal 100, and (ii) the connection between filter 25 and antenna connection terminal 100.

With the above-described configuration of radio frequency module 1, by the switching performed by switch 20, it is possible to output, from radio frequency module 1, signals of the first band and the second band which are different in power the class.

The first band and the second band are frequency bands for the communication systems established using radio access technology (RAT) predefined by standardization organizations (e.g., 3GPP and Institute of Electrical and Electronics Engineers (IEEE)). The 5th generation new radio (5G-NR) system, the long term evolution (LTE) system, a wireless local area network (WLAN) system, etc. may be used as the communication systems. However, the communication systems are not limited to these examples.

In addition, in radio frequency module 1 having the above-described configuration, the first band is, for example, n41 of 5G-NR, and the second band is, for example, one of Band 2, Band 66, Band 12, and Band 25 of the 4th Generation (4G)-LTE.

In addition, the above-described filters 15, 16, and 25 may be, for example, one of an acoustic wave filter using a surface acoustic wave (SAW), an acoustic wave filter using a bulk acoustic wave (BAW), an LC resonant filter, and a dielectric filter, but not limited to these filters. It should be noted that filters 15, 16, and 25 are not indispensable components for radio frequency circuit 10 according to the present embodiment.

Each of power amplifiers 11, 12, and 21 and switch 20 comprises at least any one of Si, GaAs, SiGe, or GaN, for example.

The following describes an example of the specific circuit configuration of radio frequency circuit 10.

2. Circuit Configuration of Radio Frequency Circuit 10A

FIG. 2 is a diagram illustrating a circuit configuration of radio frequency circuit 10A which includes a differential amplifier according to the embodiment. Radio frequency circuit 10A illustrated in the diagram is a first example of the specific circuit configuration of radio frequency circuit 10 described in FIG. 1.

As illustrated in the diagram, radio frequency circuit 10A includes transmission input terminal 110, transmission output terminal 120, divider circuit 13A, combiner circuit 14A, power amplifiers 11 and 12, amplifier 35, switch 17, capacitor C1, and filter 15.

Divider circuit 13A includes an interstage transformer including primary coil 31 (first coil) and secondary coil 32 (second coil). One end of primary coil 31 is connected to terminal 310 (first terminal), and the other end of primary coil 31 is connected to the first power supply (power supply voltage Vcc1). One end of secondary coil 32 is connected to terminal 320 (second terminal), and the other end of secondary coil 32 is connected to terminal 330 (third terminal).

Combiner circuit 14A includes an output transformer including primary coils 41 and 42 (third coil) and secondary coil 43 (fourth coil). One end of primary coil 41 is connected to terminal 420 (fourth terminal), and the other end of primary coil 42 is connected to terminal 430 (fifth terminal). One end of secondary coil 43 is connected to terminal 410 (sixth terminal), and the other end of secondary coil 43 is connected to ground.

Combiner circuit 14A further includes switches 18 and 19. Switch 18 is one example of a second switch, and is connected between the second power supply (power supply voltage Vcc2) and the other end (terminal 430) of primary coil 42. Switch 19 is one example of the third switch, and is connected between the second power supply and a connection node of primary coils 41 and 42.

Power amplifier 11 is one example of a first amplifier, and is disposed on path 81 (first path) that connects terminal 320 and terminal 420. Power amplifier 12 is one example of a second amplifier, and is disposed on path 82 (second path) that connects terminal 330 and terminal 430.

Switch 17 is one example of a first switch, and has one end connected to the path between terminal 330 and the input terminal of power amplifier 12 and the other end connected to ground.

Power amplifier 35 is disposed on the path connecting transmission input terminal 110 and terminal 310. It should be noted that amplifier 35 is not indispensable, and transmission input terminal 110 and terminal 310 may be directly connected to each other.

Filter 15 is connected between terminal 410 and transmission output terminal 120, and includes a first band in a pass band. Filter 15 may be disposed between power amplifier 11 and combiner circuit 14A as illustrated in FIG. 1, instead of being disposed between terminal 410 and transmission output terminal 120. In this case, filter 16 having the same passing characteristics as filter 15 is disposed additionally between power amplifier 12 and combiner circuit 14A. As a result of separately providing filter 15 and filter 16 on path 81 and path 82, respectively, it is possible to reduce the power durability required for filters 15 and 16. On the other hand, as a result of providing a single filter 15 between terminal 410 and transmission output terminal 120, it is possible to contribute to the miniaturization of radio frequency circuit 10.

Capacitor C1 is connected between a node on the path connecting terminal 410 and transmission output terminal 120 and ground, and adjusts the voltage conversion ratio of the output transformer included in combiner circuit 14A. Capacitor C1 may be a variable capacitor whose capacitance value changes in response to switching of switch 17. In addition, capacitor C1 is not indispensable.

With the above-described configuration, it is possible to implement the first mode and the second mode of radio frequency circuit 10A by switching switches 17 to 19. In the first mode, a signal of the first band is transferred through both paths 81 and path 82. In the second mode, a signal of the first band is transferred through only path 81.

Figure 3A:
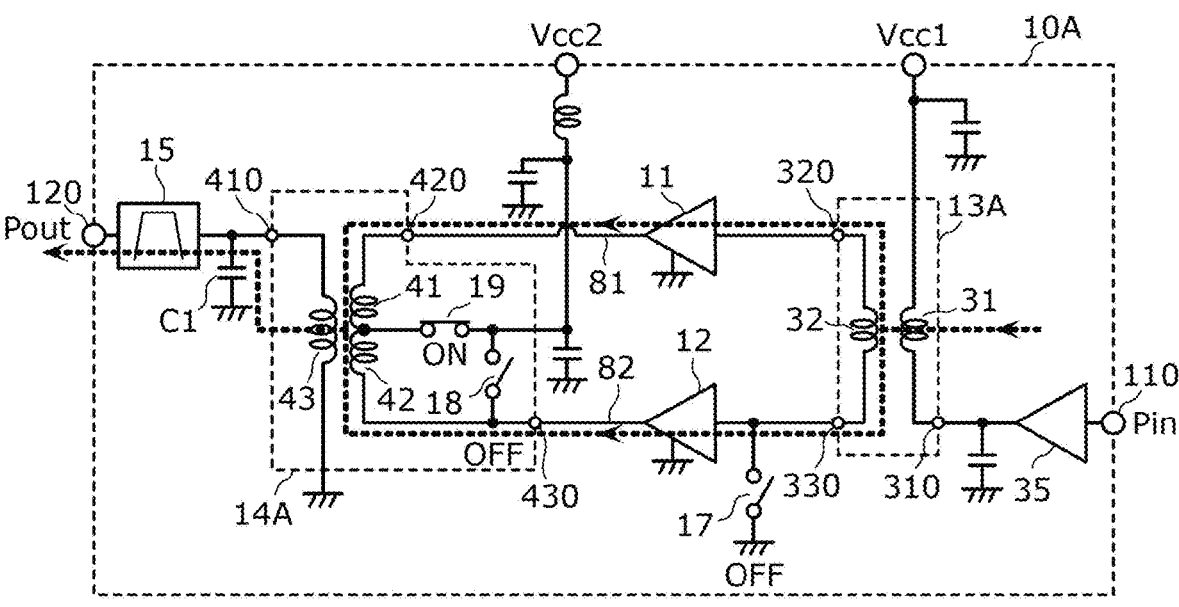
FIG. 3A is a diagram illustrating a first mode of the radio frequency circuit which includes the differential amplifier according to the embodiment.

FIG. 3A is a diagram illustrating the first mode of radio frequency circuit 10A according to the embodiment. As illustrated in the diagram, when switch 17 is in the non-conducting state, a transmission signal of the first band that has been input through transmission input terminal 110 and amplified by amplifier 35 is divided in divider circuit 13A at a predetermined division ratio, and input to power amplifiers 11 and 12. At this time, since switch 19 is in the conducting state and switch 18 is in the non-conducting state, power supply voltage Vcc2 of the second power supply is applied to power amplifier 11 via primary coil 41, and applied to power amplifier 12 via primary coil 42. In the above-described state, power amplifiers 11 and 12 both perform amplifying operations. The first transmission signal of the first band resulting from the amplification by power amplifier 11 is input to terminal 420, and the second transmission signal of the first band resulting from the amplification by power amplifier 12 is input to terminal 430. The first transmission signal is subjected to voltage conversion at a conversion ratio defined by primary coil 41 and secondary coil 43, the second transmission signal is subjected to voltage conversion at a conversion ratio defined by primary coil 42 and secondary coil 43, and the first transmission signal and the second transmission signal are combined in secondary coil 43 and output through terminal 410. The transmission signal resulting from combining the first transmission signal and the second transmission signal is subjected to voltage adjustment by capacitor C1, and output though transmission output terminal 120 via filter 15.

In other words, when switches 17 and 18 are in the non-conducting state and switch 19 is in the conducting state, the radio frequency signal of the first band is transferred through both path 81 and path 82. In the first mode, the transmission signal of the first band is amplified by the two power amplifiers 11 and 12, and thus, for example, radio frequency circuit 10A can support the high-power mode such as power class 1 (maximum output power: 31 dBm) or power class 1.5 (maximum output power: 29 dBm).

Figure 3B:
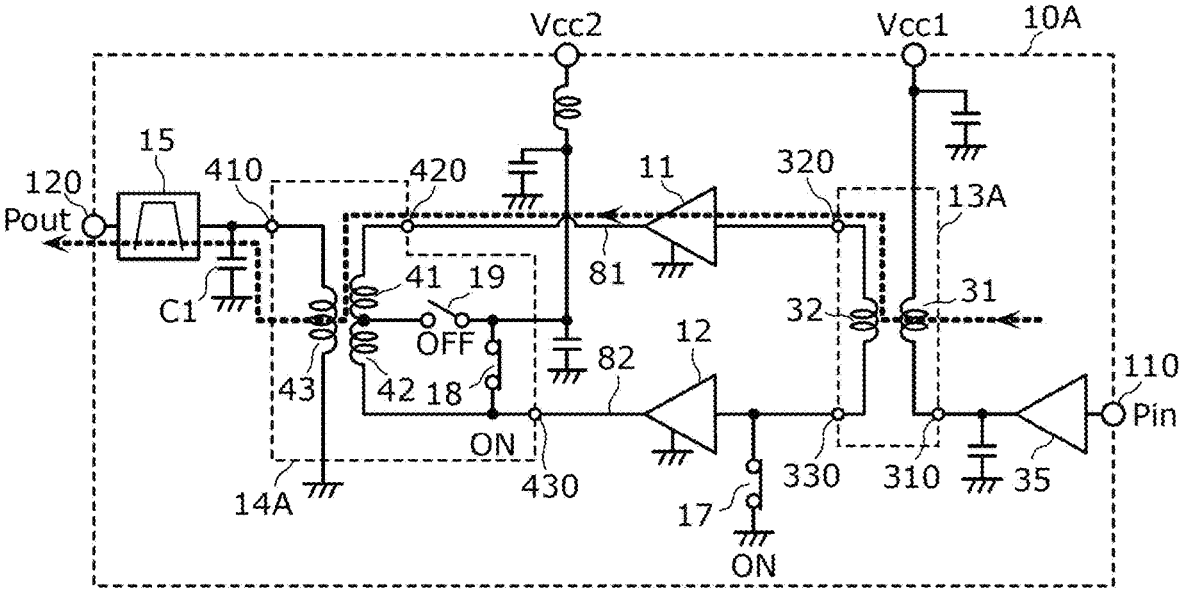
FIG. 3B is a diagram illustrating a second mode of the radio frequency circuit which includes the differential amplifier according to the embodiment.

FIG. 3B is a diagram illustrating the second mode of radio frequency circuit 10A according to the embodiment. As illustrated in the diagram, when switch 17 is in the conducting state, terminal 330 is short-circuited. Accordingly, a transmission signal of the first band that has been input through transmission input terminal 110 and amplified by amplifier 35 is input only to power amplifier 11. At this time, since switch 19 is in the non-conducting state and switch 18 is in the conducting state, power supply voltage Vcc2 of the second power supply is applied to power amplifier 11 via primary coils 41 and 42. In the above-described state, power amplifier 11 performs amplifying operations and power amplifier 12 does not perform amplifying operations. The transmission signal of the first band resulting from the amplification by power amplifier 11 is input terminal 420. This transmission signal is subjected to voltage conversion at a conversion ratio defined by primary coils 41 and 42 and secondary coil 43, output through terminal 410, subjected to voltage adjustment in capacitor C1, and output though transmission output terminal 120 via filter 15.

In other words, when switches 17 and 18 are in the conducting state and switch 19 is in the non-conducting state, a radio frequency signal of the first band is transferred through path 81, and a radio frequency signal of the first band is not transferred through path 82. In the second mode, the transmission signal of the first band is amplified by a single power amplifier 11, and thus, for example, radio frequency circuit 10A can support the non-high-power mode with a power level less than or equal to a power level of power class 2 (maximum output power: 26 dBm).

It should be noted that, when switch 17 is in the non-conducting state, the maximum output power of the radio frequency signal transferred through radio frequency circuit 10A may be greater than the maximum output power of the radio frequency signal transferred through radio frequency circuit 10A when switch 17 is in the conducting state.

In this manner, radio frequency circuit 10A can support both the high power class and non-high power class, as a result of path selection according to the power class.

With the conventional power amplifier circuits, it is not possible to support both the non-high power class and the high power class, and thus it is necessary to separately provide a power amplifier circuit for the non-high power class and a power amplifier circuit for the high power class. In this case, the circuit increases in size.

On the other hand, with radio frequency circuit 10A according to the present embodiment, by providing a switch in a single differential power amplifier circuit, it is possible to select a path according to the power class, and thus radio frequency circuit 10A with a small size which can support a wide range of power classes can be provided.

In addition, the power supply voltage applied to each of power amplifiers 11 and 12 when switch 17 is in the non-conducting state may be greater than the power supply voltage applied to power amplifier 11 when switch 17 is in the conducting state.

In this manner, since it is possible to increase the maximum output power of the power amplifier by increasing the power supply voltage, it is possible to optimize the transmission power when radio frequency circuit 10A supports the high power class.

It should be noted that, when switch 17 is in the conducting state, the power supply voltage need not necessarily be applied to power amplifier 12.

In order to adjust changes in impedance accompanying changes in the state of switch 17, capacitor C1 may have a function of switching capacity values, and an inductor may be inserted between terminal 410 and filter 15 where necessary.

In addition, the first band is any one of n41, n77, n78, or n79 of 5G-NR applicable to power class 1.5 or power class 2, and each of power amplifiers 11 and 12 may include a heterojunction bipolar transistor.

In addition, the first band is any one of n5, n12, or n71 of 5G-NR applicable to power class 1, and each of power amplifiers 11 and 12 may include a transistor comprising gallium nitride.

3. Circuit Configuration of Radio Frequency Circuit 10B

Figure 4:
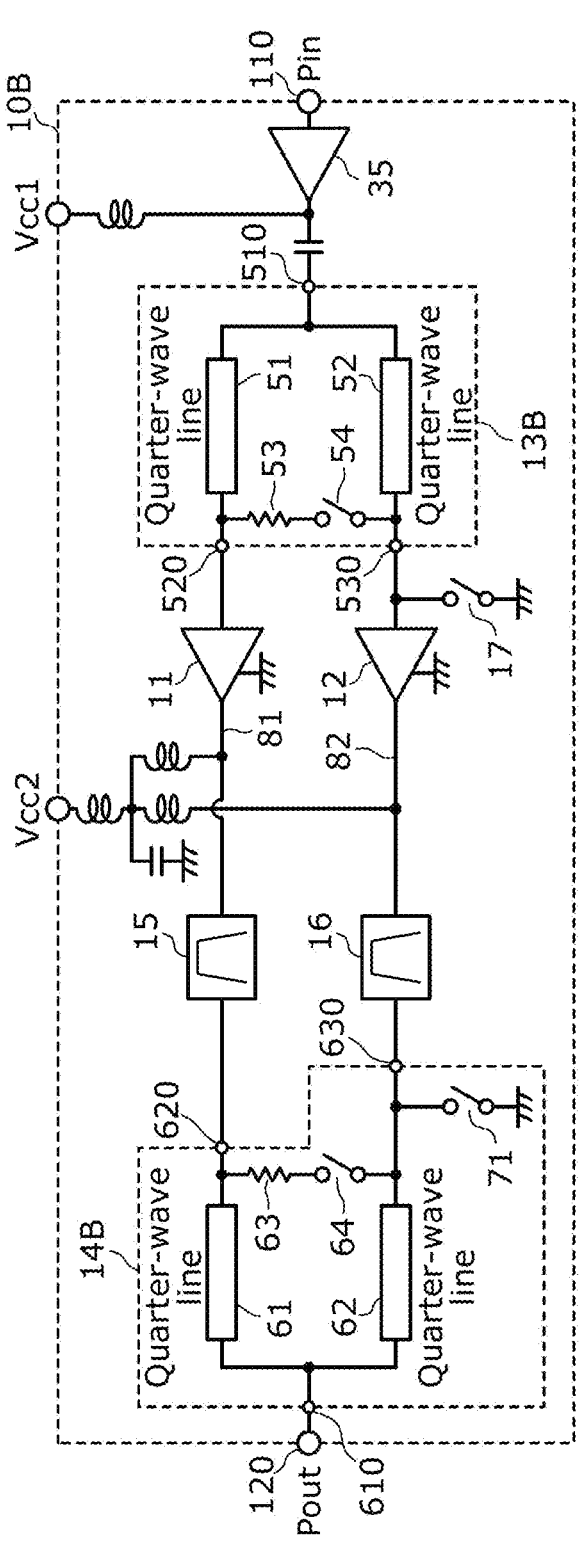
FIG. 4 is a diagram illustrating a circuit configuration of the radio frequency circuit of a Wilkinson type according to the embodiment.

FIG. 4 is a diagram illustrating a circuit configuration of radio frequency circuit 10B which includes divider circuit 13B and combiner circuit 14B of the Wilkinson type according to the embodiment. Radio frequency circuit 10B illustrated in the diagram is a second example of the specific circuit configuration of radio frequency circuit 10 described in FIG. 1.

As illustrated in the diagram, radio frequency circuit 10B includes transmission input terminal 110, transmission output terminal 120, divider circuit 13B, combiner circuit 14B, power amplifiers 11 and 12, amplifier 35, switch 17, and filters 15 and 16.

Divider circuit 13B includes quarter-wave line 51 (first quarter-wave line) and quarter-wave line 52 (second quarter-wave line), resistor 53 (first resistive element), and switch 54 (third switch). One end of quarter-wave line 51 and one end of quarter-wave line 52 are connected to terminal 510 (first terminal), the other end of quarter-wave line 51 is connected to terminal 520 (second terminal), and the other end of quarter-wave line 52 is connected to terminal 530 (third terminal).

Resistor 53 and switch 54 are connected in series between the other end of quarter-wave line 51 and the other end of quarter-wave line 52.

Combiner circuit 14B includes quarter-wave line 61 (third quarter-wave line) and quarter-wave line 62 (fourth quarter-wave line), resistor 63 (second resistive element), switch 64 (fourth switch), and switch 71 (second switch). One end of quarter-wave line 61 and one end of quarter-wave line 62 are connected to terminal 610 (sixth terminal). The other end of quarter-wave line 61 is connected to terminal 620 (fourth terminal), and the other end of quarter-wave line 62 is connected to terminal 630 (fifth terminal).

Resistor 63 and switch 64 are connected in series between the other end of quarter-wave line 61 and the other end of quarter-wave line 62. One end of switch 71 is connected to the path that connects the other end of quarter-wave line 62 and the output terminal of power amplifier 12, and the other end of switch 71 is connected to ground.

Power amplifier 11 is one example of a first amplifier, and is disposed on path 81 (first path) that connects terminal 520 and terminal 620. Power amplifier 12 is one example of a second amplifier, and is disposed on path 82 (second path) that connects terminal 530 and terminal 630.

Switch 17 is one example of a first switch, and has one end connected to the path that that connects terminal 530 and the input terminal of power amplifier 12, and the other end connected to ground.

Amplifier 35 is disposed on the path connecting transmission input terminal 110 and terminal 510. It should be noted that amplifier 35 is not indispensable, and transmission input terminal 110 and terminal 510 may be directly connected to each other.

Filter 15 is connected between power amplifier 11 and combiner circuit 14B, and includes the first band in the pass band. Filter 16 is connected between power amplifier 12 and combiner circuit 14B, and includes the first band in the pass band. It should be noted that, instead of the above-described arrangement configuration, one filter out of filters 15 and 16 may be disposed between terminal 610 and transmission output terminal 120.

With the above-described configuration, it is possible to implement the first mode and the second mode of radio frequency circuit 10B by switching switches 17, 54, 64, and

71. In the first mode, a signal of the first band is transferred through both first path 81 and second path 82. In the second mode, a signal of the first band is transferred through only first path 81.

It should be noted that, in radio frequency circuit 10B, resistor 53 and switch 54 are not indispensable. In addition, in radio frequency circuit 10B, resistor 63 and switch 64 are not indispensable.

Figure 5A:
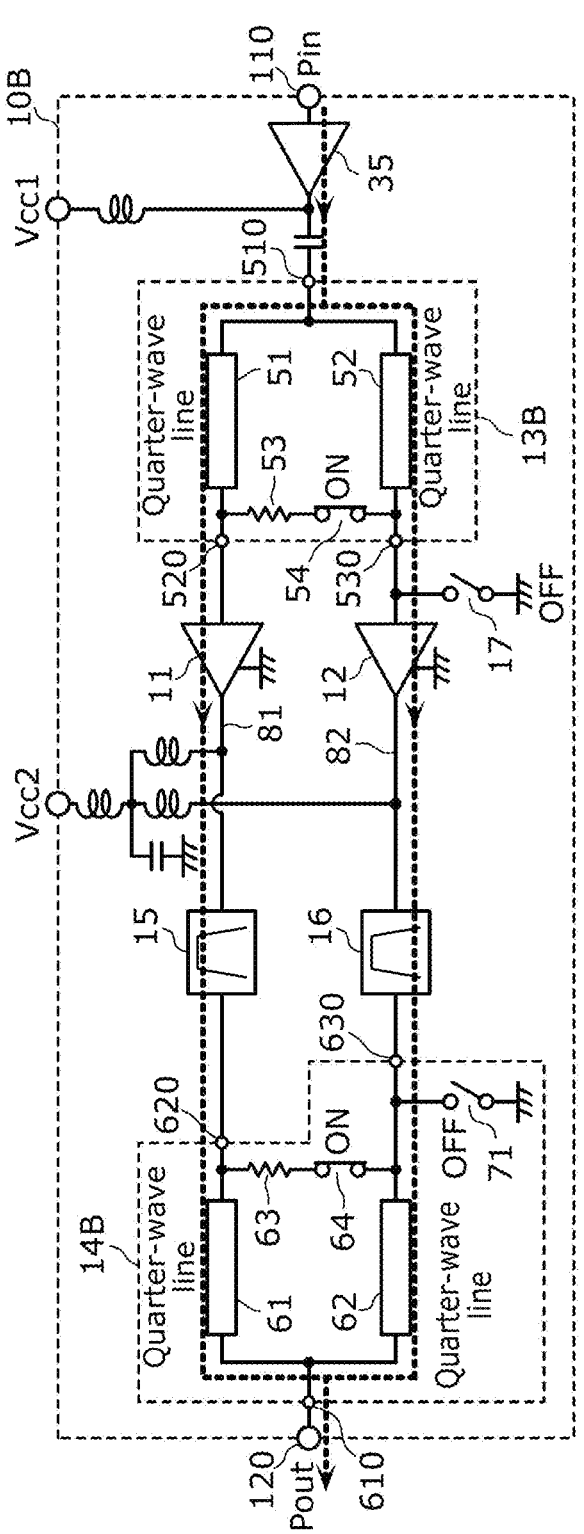
FIG. 5A is a diagram illustrating the first mode of the radio frequency circuit of the Wilkinson type according to the embodiment.

FIG. 5A is a diagram illustrating the first mode of radio frequency circuit 10B according to the embodiment. As illustrated in the diagram, when switches 17 and 71 are in the non-conducting state, a transmission signal of the first band that has been input through transmission input terminal 110 and amplified by amplifier 35 is divided in divider circuit 13B at a predetermined division ratio, and input to power amplifiers 11 and 12. At this time, switches 54 and 64 are in the conducting state, and thus it is possible to attenuate the signals of the reverse-phase components transferred through paths 81 and 82, by resistors 53 and 63. As a result, it is possible to effectively combine the signals in phase transferred through paths 81 and 82, by combiner circuit 14B. In addition, power supply voltage Vcc2 of the second power supply is applied to each of power amplifiers 11 and 12. In the above-described state, power amplifiers 11 and 12 both perform the amplifying operation. The first transmission signal of the first band amplified by power amplifier 11 and the second transmission signal of the first band amplified by power amplifier 12 are combined by combiner circuit 14B, and output through transmission output terminal 120.

In other words, when switches 17 and 71 are in the non-conducting state and switches 54 and 64 are in the conducting state, the radio frequency signal of the first band is transferred through both paths 81 and 82. In the first mode, the transmission signal of the first band is amplified by the two power amplifiers 11 and 12, and thus radio frequency circuit 10B can support the high-power modes such as power class 1 (maximum output power: 31 dBm) and power class 1.5 (maximum output power: 29 dBm).

Figure 5B:
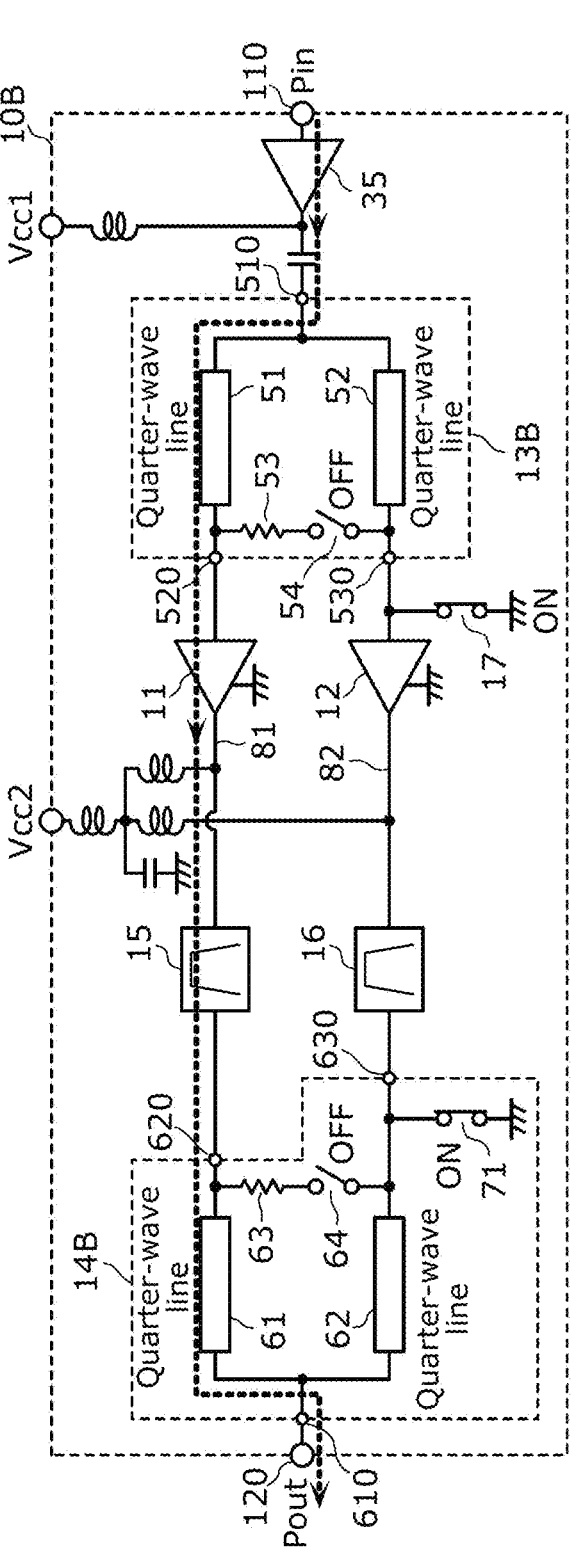
FIG. 5B is a diagram illustrating the second mode of the radio frequency circuit of the Wilkinson type according to the embodiment.

FIG. 5B is a diagram illustrating the second mode of radio frequency circuit 10B according to the embodiment. As illustrated in the diagram, when switch 17 is in the conducting state, quarter-wave line 52 and switch 17 form an open stub. Accordingly, the impedance when power amplifier 12 is viewed from terminal 510 is open, and thus the transmission signal of the first band that has been input through transmission input terminal 110 and amplified by amplifier 35 is not input to power amplifier 12 but input only to power amplifier 11. At this time, since switches 54 and 64 are in the non-conducting state, the first transmission signal transferred through path 81 does not leak to path 82. In addition, since switch 71 is in the conducting state, it is possible to inhibit a noise signal output from power amplifier 12 from entering combiner circuit 14B. In the above-described state, power amplifier 11 performs the amplifying operation and power amplifier 12 does not perform the amplifying operation. The transmission signal of the first band resulting from the amplification by power amplifier 11 is input through terminal 620, and output from transmission output terminal 120.

In other words, when switches 17 and 71 are in the conducting state and switches 54 and 64 are in the non-conducting state, a radio frequency signal of the first band is transferred through path 81, and a radio frequency signal of the first band is not transferred through path 82. In the second mode, the transmission signal of the first band is amplified by a single power amplifier 11, and thus radio frequency circuit 10B) can support the non-high power mode with a power level less than or equal to a power level of power class 2 (maximum output power: 26 dBm), for example.

It should be noted that, when switch 17 is in the non-conducting state, the maximum output power of the radio frequency signal transferred through radio frequency circuit 10B may be greater than the maximum output power of the radio frequency signal transferred through radio frequency circuit 10B when switch 17 is in the conducting state.

In this manner, radio frequency circuit 10B can support both the high power class and the non-high power class, as a result of path selection according to the power class.

With radio frequency circuit 10B according to the present embodiment, by providing a switch in a single amplifier circuit of the Wilkinson type, it is possible to select a path according to the power class. As a result, it is possible to provide radio frequency circuit 10B with a small size which can support a wide range of power classes.

In addition, the power supply voltage applied to each of power amplifiers 11 and 12 when switch 17 is in the non-conducting state may be greater than the power supply voltage applied to power amplifier 11 when switch 17 is in the conducting state.

According to the-above described configuration, when radio frequency circuit 10B supports the high power class, it is possible to optimize the transmission power.

It should be noted that, when switch 17 is in the conducting state, the power supply voltage need not necessarily be applied to power amplifier 12.

In addition, the first band is any one of n41, n77, n78, or n79 of 5G-NR applicable to power class 1.5 or power class 2, and each of power amplifiers 11 and 12 may include a heterojunction bipolar transistor.

In addition, the first band is any one of n5, n12, or n71 of 5G-NR applicable to power class 1, and each of power amplifiers 11 and 12 may include a transistor comprising gallium nitride.

It should be noted, instead of quarter-wave lines 51 and 52, a T-type or n-type LC circuit may be employed. In addition, instead of quarter-wave lines 61 and 62, a T-type or n-type LC circuit may be employed.

4. Advantageous Effects, Etc

As described above, radio frequency circuit 10 according to the present embodiment includes: divider circuit 13 that divides a radio frequency signal input through terminal 310, and outputs radio frequency signals resulting from the dividing, respectively through terminals 320 and 330; combiner circuit 14 that combines a radio frequency signal input through terminal 420 and a radio frequency signal input through terminal 430, and outputs a radio frequency signal resulting from the combining from terminal 410; power amplifier 11 that is disposed on path 81 connecting terminal 320 and terminal 420, amplifies a radio frequency signal output through terminal 320, and outputs the radio frequency signal amplified to terminal 420; power amplifier 12 that is disposed on path 82 connecting terminal 330 and terminal 430, amplifies a radio frequency signal output through terminal 330, and outputs the radio frequency signal amplified to terminal 430; and switch 17 that is connected between terminal 330 and an input terminal of power amplifier 12, and is switched between a conducting state and a non-conducting state according to a power class.

According to the above-described configuration, by switching between the conducting state and the non-conducting state of switch 17, it is possible to select: transferring a radio frequency signal resulting from power-combining signals transferred through path 81 and path 82; or transferring only a radio frequency signal transferred through path 81. As a result, it is possible to provide radio frequency circuit 10 with a small size which can support both a high power class and a non-high power class.

In addition, switch 17 may have one end connected to a path connecting terminal 330 and the input terminal of power amplifier 12, and the other end connected to ground.

According to this configuration, switch 17 is not disposed directly on the transfer path of radio frequency signals, and thus it is possible to reduce the transfer losses.

In addition, in radio frequency circuit 10: when switch 17 is in the conducting state, a radio frequency signal of a first band may be transferred through path 81, and the radio frequency signal of the first band may not be transferred through path 82; and when switch 17 is in the non-conducting state, the radio frequency signal of the first band may be transferred through both path 81 and path 82.

In addition, in radio frequency circuit 10: the first band may be any one of n41, n77, n78, or n79 of 5G-NR applicable to power class 1.5 or power class 2; and each of power amplifiers 11 and 12 may include a heterojunction bipolar transistor.

In addition, in radio frequency circuit 10, the first band may be any one of n5, n12, or n71 of 5G-NR applicable to power class 1, and each of power amplifiers 11 and 12 may include a transistor comprising gallium nitride.

In addition, in radio frequency circuit 10, when switch 17 is in the non-conducting state, the maximum output power of the radio frequency signal transferred through radio frequency circuit 10 may be greater than the maximum output power of the radio frequency signal transferred through radio frequency circuit 10 when switch 17 is in the conducting state.

With the above-described configuration, radio frequency circuit 10 can support both the high power class and the non-high power class, as a result of path selection according to the power class.

In addition, in radio frequency circuit 10, the power supply voltage applied to power amplifier 11 when switch 17 is in the non-conducting state may be greater than the power supply voltage applied to power amplifier 11 when switch 17 is in the conducting state.

With the above-described configuration, since it is possible to increase the maximum output power of the power amplifier by increasing the power supply voltage, it is possible to optimize the transmission power when radio frequency circuit 10 supports the high power class.

In addition, in radio frequency circuit 10A, divider circuit 13A includes an interstage transformer including primary coil 31 and secondary coil 32, one end of primary coil 31 is connected to terminal 310, the other end of primary coil 31 is connected to the first power supply, one end of secondary coil 32 is connected to terminal 320, and the other end of secondary coil 32 is connected to terminal 330. In addition, combiner circuit 14A includes an output transformer including primary coils 41 and 42 and secondary coil 43, one end of primary coil 41 is connected to terminal 420, the other end of primary coil 42 is connected to terminal 430, one end of secondary coil 43 is connected to terminal 410, and the other end of secondary coil 43 is connected to ground. Combiner circuit 14A may further include switch 18 connected between the second power supply and the other end of primary coil 42, and switch 19 connected between the second power supply and the node located between primary coil 41 and primary coil 42.

In addition, in radio frequency circuit 10A: when switches 17 and 18 are in the conducting state and switch 19 is in the non-conducting state, a radio frequency signal of the first band may be transferred through path 81, and the radio frequency signal of the first band may not be transferred through path 82; and when switches 17 and 18 are in the non-conducting state and switch 19 is in the conducting state, the radio frequency signal of the first band may be transferred through both path 81 and path 82.

According to this configuration, it is possible to provide radio frequency circuit 10A with a small size which can support both the high power class and the non-high power class.

In addition, in radio frequency circuit 10B: divider circuit 13B includes quarter-wave lines 51 and 52, one end of quarter-wave line 51 and one end of quarter-wave line 52 are connected to terminal 510, the other end of quarter-wave line 51 is connected to terminal 520, and the other end of quarter-wave line 52 is connected to terminal 530. In addition, combiner circuit 14B may include quarter-wave lines 61 and 62 and switch 71, one end of quarter-wave line 61 and one end of quarter-wave line 62 may be connected to terminal 610, the other end of quarter-wave line 61 may be connected to terminal 620, the other end of quarter-wave line 62 may be connected to terminal 630, and switch 71 may have: one end connected to the path connecting the other end of quarter-wave line 62 and the output terminal of amplifier 12; and the other end connected to ground.

In addition, in radio frequency circuit 10B, divider circuit 13B further includes resistor 53 and switch 54, and resistor 53 and switch 54 are connected in series between the other end of quarter-wave line 51 and the other end of quarter-wave line 52. In addition, combiner circuit 14B may further include resistor 63 and switch 64, and resistor 63 and switch 64 may be connected in series between the other end of quarter-wave line 61 and the other end of quarter-wave line 62.

In addition, in radio frequency circuit 10B: when switch 17 and switch 71 are in the conducting state and switch 54 and switch 64 are in the non-conducting state, the radio frequency signal of the first band may be transferred through path 81, and the radio frequency signal of the first band may not be transferred through path 82; and when switch 17 and switch 71 are in the non-conducting state and switch 54 and switch 64 are in the conducting state, the radio frequency signal of the first band may be transferred through both path 81 and path 82.

According to this configuration, it is possible to provide radio frequency circuit 10B with a small size which can support both the high power class and the non-high power class.

In addition, radio frequency module 1 according to the present embodiment includes: radio frequency circuit 10; power amplifier 21; filter 25 that is connected to an output terminal of power amplifier 21, and includes a second band in a pass band; and switch 20 that switches between connecting radio frequency circuit 10 and antenna connection terminal 100 and connecting filter 25 and antenna connection terminal 100. Radio frequency circuit 10 further includes: filter 15 that is disposed on path 81, and includes the first band in the pass band; and filter 16 that is disposed on path 82, and includes the first band in the pass band. Here, the first band is n41 of 5G-NR, and the second band is any one of Band 2, Band 66, Band 12, or Band 25 of 4G-LTE.

With the above-described configuration, switching of switch 20 enables outputting, from radio frequency module 1, a signal of the first band and a signal of second band which differ in the power class.

In addition, communication device 5 includes: RFIC 3 that processes a radio frequency signal which is to be transmitted or has been received by antenna 2; and radio frequency circuit 10 or radio frequency module 1 which transfers the radio frequency signal between antenna 2 and RFIC 3.

According to this configuration, it is possible to provide communication device 5 with a small size which can support a wide range of power classes.

Other Embodiments, Etc

Although the radio frequency circuit, the radio frequency module, and the communication device according to the embodiment of the present disclosure have been described above based on the embodiment, the radio frequency circuit, the radio frequency module, and the communication device according to the present disclosure are not limited to the foregoing embodiment. The present disclosure also encompasses other embodiments achieved by combining arbitrary structural elements in the above-described embodiments, variations resulting from various modifications to the above-described embodiments that may be conceived by those skilled in the art without departing from the essence of the present disclosure, and various devices that include the above-described radio frequency circuit, radio frequency module, and communication device.

For example, in the radio frequency circuit, the radio frequency module, and the communication device according to the foregoing embodiment, another circuit element and line, for example, may be inserted in the path connecting circuit elements and the signal path which are disclosed in the drawings.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The present disclosure is applicable widely to communication apparatuses such as mobile phones as a radio frequency circuit and a radio frequency module that are disposed in a multiband-compatible front-end unit.

The invention claimed is:

1. A radio frequency circuit, comprising:
   a divider circuit configured to divide a radio frequency signal input through a first terminal, and output radio frequency signals resulting from the dividing, respectively through a second terminal and a third terminal;
   a combiner circuit configured to combine a radio frequency signal input through a fourth terminal and a radio frequency signal input through a fifth terminal, and output a radio frequency signal resulting from the combining, through a sixth terminal;
   a first amplifier disposed on a first path connecting the second terminal and the fourth terminal, the first amplifier being configured to amplify a radio frequency signal output through the second terminal, and output the radio frequency signal amplified to the fourth terminal;

a second amplifier disposed on a second path connecting the third terminal and the fifth terminal, the second amplifier being configured to amplify a radio frequency signal output through the third terminal, and output the radio frequency signal amplified to the fifth terminal; and a first switch connected between the third terminal and an input terminal of the second amplifier, the first switch being switched between a conducting state and a non-conducting state according to a power class, wherein the first switch includes one end connected to a path connecting the third terminal and the input terminal of the second amplifier, and an other end connected to ground, and when the first switch is in the conducting state, a radio frequency signal of a first band is transferred through the first path and not transferred through the second path, and when the first switch is in the non-conducting state, the radio frequency signal of the first band is transferred through both the first path and the second path.

2. The radio frequency circuit of claim 1, wherein the first band is any one of n41, n77, n78, or n79 of 5th generation new radio (5G-NR) applicable to power class 1.5 or power class 2, and the first amplifier and the second amplifier each include a heterojunction bipolar transistor.

3. The radio frequency circuit of claim 1, wherein the first band is any one of n5, n12, or n71 of SG-NR applicable to power class 1, and the first amplifier and the second amplifier each include a transistor comprising gallium nitride.

4. A radio frequency circuit, comprising:

a divider circuit configured to divide a radio frequency signal input through a first terminal, and output radio frequency signals resulting from the dividing, respectively through a second terminal and a third terminal;

a combiner circuit configured to combine a radio frequency signal input through a fourth terminal and a radio frequency signal input through a fifth terminal, and output a radio frequency signal resulting from the combining, through a sixth terminal;

a first amplifier disposed on a first path connecting the second terminal and the fourth terminal, the first amplifier being configured to amplify a radio frequency signal output through the second terminal, and output the radio frequency signal amplified to the fourth terminal;

a second amplifier disposed on a second path connecting the third terminal and the fifth terminal, the second amplifier being configured to amplify a radio frequency signal output through the third terminal, and output the radio frequency signal amplified to the fifth terminal; and a first switch connected between the third terminal and an input terminal of the second amplifier, the first switch being switched between a conducting state and a non-conducting state according to a power class, wherein the first switch includes one end connected to a path connecting the third terminal and the input terminal of the second amplifier, and an other end connected to ground, and a maximum output power of a radio frequency signal transferred through the radio frequency circuit when the first switch is in the non-conducting state is greater than a maximum output power of a radio frequency signal transferred through the radio frequency circuit when the first switch is in the conducting state.

5. The radio frequency circuit of claim 1, wherein a power supply voltage applied to the first amplifier when the first switch is in the non-conducting state is greater than a power supply voltage applied to the first amplifier when the first switch is in the conducting state.

6. The radio frequency circuit of claim 1, wherein the divider circuit includes an interstage transformer including a first coil and a second coil, the first coil includes one end connected to the first terminal and an other end connected to a first power supply, the second coil includes one end connected to the second terminal and an other end connected to the third terminal, the combiner circuit includes an output transformer including a third coil and a fourth coil, the third coil includes one end connected to the fourth terminal and an other end connected to the fifth terminal, the fourth coil includes one end connected to the sixth terminal and an other end connected to ground, and the combiner circuit further includes:

a second switch connected between a second power supply and the other end of the third coil; and a third switch connected between the second power supply and a node located between the one end and the other end of the third coil.

7. The radio frequency circuit of claim 6, wherein when the first switch and the second switch are in the conducting state and the third switch is in the non-conducting state, a radio frequency signal of the first band is transferred through the first path and not transferred through the second path, and when the first switch and the second switch are in the non-conducting state and the third switch is in the conducting state, the radio frequency signal of the first band is transferred through both the first path and the second path.

8. The radio frequency circuit of claim 1, wherein the divider circuit includes:

a first quarter-wave line; and a second quarter-wave line, one end of the first quarter-wave line and one end of the second quarter-wave line are connected to the first terminal, an other end of the first quarter-wave line is connected to the second terminal, an other end of the second quarter-wave line is connected to the third terminal, the combiner circuit includes:

a third quarter-wave line;

a fourth quarter-wave line; and a second switch, one end of the third quarter-wave line and one end of the fourth quarter-wave line are connected to the sixth terminal, an other end of the third quarter-wave line is connected to the fourth terminal, an other end of the fourth quarter-wave line is connected to the fifth terminal, and the second switch includes one end connected to a path connecting the other end of the fourth quarter-wave line and the output terminal of the second amplifier, and an other end connected to ground.

9. The radio frequency circuit of claim 8, wherein the divider circuit further includes:

a first resistive element; and a third switch, the first resistive element and the third switch are connected in series between the other end of the first quarter-wave line and the other end of the second quarter-wave line, the combiner circuit further includes:

a second resistive element; and a fourth switch, and the second resistive element and the fourth switch are connected in series between the other end of the third quarter-wave line and the other end of the fourth quarter-wave line.

10. The radio frequency circuit of claim 9, wherein when the first switch and the second switch are in the conducting state and the third switch and the fourth switch are in the non-conducting state, a radio frequency signal of the first band is transferred through the first path, and the radio frequency signal of the first band is not transferred through the second path, and when the first switch and the second switch are in the non-conducting state and the third switch and the fourth switch are in the conducting state, the radio frequency signal of the first band is transferred through both the first path and the second path.

11. A radio frequency module comprising:

a radio frequency circuit including:

a divider circuit configured to divide a radio frequency signal input through a first terminal, and output radio frequency signals resulting from the dividing, respectively through a second terminal and a third terminal;

a combiner circuit configured to combine a radio frequency signal input through a fourth terminal and a radio frequency signal input through a fifth terminal, and output a radio frequency signal resulting from the combining through a sixth terminal;

a first amplifier disposed on a first path connecting the second terminal and the fourth terminal, the first amplifier being configured to amplify a radio frequency signal output through the second terminal, and output the radio frequency signal amplified to the fourth terminal;

a second amplifier disposed on a second path connecting the third terminal and the fifth terminal, the second amplifier being configured to amplify a radio frequency signal output through the third terminal, and output the radio frequency signal amplified to the fifth terminal; and a first switch connected between the third terminal and an input terminal of the second amplifier, the first switch being switched between a conducting state and a non-conducting state according to a power class, a third amplifier;

a first filter that is connected to an output terminal of the third amplifier, and includes a second band in a pass band; and a fifth switch configured to switch between connecting the radio frequency circuit and an antenna connection terminal and connecting the first filter and the antenna connection terminal, wherein the radio frequency circuit further includes:

a second filter that is disposed on the first path, and includes a first band in the pass band; and a third filter that is disposed on the second path, and includes the first band in the pass band, the first band is n41 of 5G-NR, and the second band is any one of Band 2, Band 66, Band 12, or Band 25 of 4th generation long term evolution (4G-LTE).

12. A communication device comprising:

a radio frequency (RF) signal processing circuit configured to process a radio frequency signal which is to be transmitted or has been received by an antenna; and the radio frequency circuit of claim 1 configured to transfer the radio frequency signal between the antenna and the RF signal processing circuit.

13. The radio frequency module of claim 11, wherein the first switch includes one end connected to a path connecting the third terminal and the input terminal of the second amplifier, and an other end connected to ground, when the first switch is in the conducting state, a radio frequency signal of a first band is transferred through the first path and not transferred through the second path, and when the first switch is in the non-conducting state, the radio frequency signal of the first band is transferred through both the first path and the second path.

14. The radio frequency module of claim 13, wherein a maximum output power of a radio frequency signal transferred through the radio frequency circuit when the first switch is in the non-conducting state is greater than a maximum output power of a radio frequency signal transferred through the radio frequency circuit when the first switch is in the conducting state.

15. The radio frequency module of claim 13, wherein a power supply voltage applied to the first amplifier when the first switch is in the non-conducting state is greater than a power supply voltage applied to the first amplifier when the first switch is in the conducting state.

16. The communication device of claim 12, wherein the first switch includes one end connected to a path connecting the third terminal and the input terminal of the second amplifier, and an other end connected to ground, when the first switch is in the conducting state, a radio frequency signal of a first band is transferred through the first path and not transferred through the second path, and when the first switch is in the non-conducting state, the radio frequency signal of the first band is transferred through both the first path and the second path.

17. The communication device of claim 16, wherein a maximum output power of a radio frequency signal transferred through the radio frequency circuit when the first switch is in the non-conducting state is greater than a maximum output power of a radio frequency signal transferred through the radio frequency circuit when the first switch is in the conducting state.

18. The communication device of claim 16, wherein a power supply voltage applied to the first amplifier when the first switch is in the non-conducting state is greater than a power supply voltage applied to the first amplifier when the first switch is in the conducting state.

19. The radio frequency circuit of claim 4, wherein a power supply voltage applied to the first amplifier when the first switch is in the non-conducting state is greater than a power supply voltage applied to the first amplifier when the first switch is in the conducting state.

20. The radio frequency circuit of claim 4, wherein
the divider circuit includes an interstage transformer
 including a first coil and a second coil,
the first coil includes one end connected to the first
 terminal and an other end connected to a first power
 supply,
the second coil includes one end connected to the second
 terminal and an other end connected to the third ter-
 minal,
the combiner circuit includes an output transformer
 including a third coil and a fourth coil,
the third coil includes one end connected to the fourth
 terminal and an other end connected to the fifth termi-
 nal,
the fourth coil includes one end connected to the sixth
 terminal and an other end connected to ground, and
the combiner circuit further includes:
  a second switch connected between a second power
   supply and the other end of the third coil; and
  a third switch connected between the second power
   supply and a node located between the one end and
   the other end of the third coil.

\*   \*   \*   \*   \*